United States Patent
Schweitzer, III et al.

(10) Patent No.: US 11,280,834 B2
(45) Date of Patent: Mar. 22, 2022

(54) DETECTION OF LOW-ENERGY EVENTS IN AN ELECTRIC POWER SYSTEM

(71) Applicant: Schweitzer Engineering Laboratories, Inc., Pullman, WA (US)

(72) Inventors: Edmund O. Schweitzer, III, Pullman, WA (US); Armando Guzman-Casillas, Pullman, WA (US); Veselin Skendzic, Schwenksville, PA (US); Mangapathirao Venkata Mynam, Pullman, WA (US); Bogdan Z. Kasztenny, Markham (CA)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 128 days.

(21) Appl. No.: 16/549,853

(22) Filed: Aug. 23, 2019

(65) Prior Publication Data
US 2020/0072904 A1 Mar. 5, 2020

Related U.S. Application Data

(60) Provisional application No. 62/725,182, filed on Aug. 30, 2018.

(51) Int. Cl.
*G01R 31/58* (2020.01)
*G01R 31/327* (2006.01)
(Continued)

(52) U.S. Cl.
CPC ....... *G01R 31/3275* (2013.01); *G01R 21/133* (2013.01); *G01R 31/085* (2013.01); *G01R 31/58* (2020.01)

(58) Field of Classification Search
CPC .............. G01R 31/3275; G01R 21/133; G01R 31/085; G01R 31/58; G01R 31/083;
(Continued)

(56) References Cited

U.S. PATENT DOCUMENTS 3,585,298 A 6/1971 Liberman
3,670,240 A 6/1972 Maranchak
(Continued)

FOREIGN PATENT DOCUMENTS

EP 226210 12/1986
EP 241832 7/1990
(Continued)

OTHER PUBLICATIONS

Harshad Mehta, Fault Location Techniques for High-Voltage DC Lines, EPRI EL-4331 Project 2150-1, 1985.
(Continued)

*Primary Examiner* — Lee E Rodak
*Assistant Examiner* — Brent J Andrews
(74) *Attorney, Agent, or Firm* — Bradley W. Schield; Richard M. Edge

(57) ABSTRACT

The present disclosure relates to determining locations of low-energy events on power lines. For example, an IED may receiving an input signal indicating a local electrical condition of a power line. The IED may detect traveling waves on the power line based on the local electrical condition. The IED may detect traveling waves on the power line based on the local and remote electrical conditions. The IED may determine that the traveling waves are associated with a low-energy event. The IED may determine the location of the low-energy event on the power line based at least in part on the traveling waves.

19 Claims, 5 Drawing Sheets

(51) Int. Cl.
  *G01R 31/08* (2020.01)
  *G01R 21/133* (2006.01)
(58) Field of Classification Search
  CPC ........ G01R 31/11; G01R 31/08; G01R 13/02; G01R 31/088; H02H 1/0092; H02H 1/003
  See application file for complete search history.

(56) References Cited

U.S. PATENT DOCUMENTS

| | | |
|---|---|---|
| 3,878,460 A | 4/1975 | Nimmersjö |
| 3,890,544 A | 6/1975 | Chamia |
| 3,956,671 A | 5/1976 | Nimmersjö |
| 4,053,816 A | 10/1977 | Nimmersjö |
| 4,254,444 A | 3/1981 | Eriksson |
| 4,296,452 A | 10/1981 | Eriksson |
| 4,344,142 A | 8/1982 | Diehr |
| 4,351,011 A | 9/1982 | Liberman |
| 4,377,834 A | 3/1983 | Eriksson |
| 4,499,417 A | 2/1985 | Wright |
| 4,614,936 A | 9/1986 | Weidenbruch |
| 4,626,772 A | 12/1986 | Michel |
| 4,739,491 A | 4/1988 | Baldock |
| 4,766,549 A | 8/1988 | Schweitzer |
| 4,797,805 A | 1/1989 | Nimmersjö |
| 4,800,509 A | 1/1989 | Nimmersjö |
| 5,198,746 A | 3/1993 | Gyugyi |
| 5,255,202 A | 10/1993 | Kido |
| 5,365,177 A | 11/1994 | Hamp |
| 5,428,553 A | 6/1995 | Chiba |
| 5,446,387 A | 8/1995 | Eriksson |
| 5,572,138 A | 11/1996 | Nimmersjö |
| 5,682,100 A | 10/1997 | Rossi |
| 5,729,144 A | 3/1998 | Cummins |
| 6,341,055 B1 | 1/2002 | Guzman-Casillas |
| 6,417,791 B1 | 7/2002 | Benmouyal |
| 6,466,031 B1 | 10/2002 | Hu |
| 6,477,475 B1 | 11/2002 | Takaoka |
| 6,597,180 B1 | 7/2003 | Takaoka |
| 6,686,832 B2 | 2/2004 | Abraham |
| 6,798,211 B1 | 9/2004 | Rockwell |
| 7,174,261 B2 | 2/2007 | Gunn |
| 7,535,233 B2 | 5/2009 | Kojovic |
| 7,714,735 B2 | 5/2010 | Rockwell |
| 7,733,094 B2 | 6/2010 | Bright |
| 7,930,117 B2 | 4/2011 | Guzman-Casillas |
| 8,315,827 B2 | 11/2012 | Faybisovich |
| 8,525,522 B2 | 9/2013 | Gong |
| 8,532,944 B2 | 9/2013 | Vetter |
| 8,598,887 B2 | 12/2013 | Bjorklund |
| 8,655,608 B2 | 2/2014 | Guzman-Casillas |
| 8,655,609 B2 | 2/2014 | Schweitzer |
| 8,779,931 B2 | 7/2014 | Yaney |
| 8,781,766 B2 | 7/2014 | Schweitzer |
| 8,941,387 B2 | 1/2015 | Kim |
| 8,990,036 B1 | 3/2015 | Schweitzer |
| 9,194,898 B2 | 11/2015 | Banhegyesi et al. |
| 9,470,748 B2 | 10/2016 | Schweitzer |
| 9,594,112 B2 | 3/2017 | Schweitzer |
| 9,627,881 B2 | 4/2017 | Schweitzer |
| 10,180,451 B2 | 1/2019 | Schweitzer |
| 10,581,237 B2 | 3/2020 | Schweitzer, III |
| 2001/0012984 A1 | 8/2001 | Adamiak |
| 2002/0071452 A1 | 6/2002 | Abraham |
| 2002/0165462 A1 | 11/2002 | Westbrook |
| 2003/0058243 A1 | 3/2003 | Faust |
| 2003/0222873 A1 | 12/2003 | Ritter |
| 2004/0189317 A1 | 9/2004 | Borchert |
| 2004/0230387 A1 | 11/2004 | Bechhoefer |
| 2005/0151659 A1 | 7/2005 | Donovan |
| 2006/0012374 A1 | 1/2006 | Kojovic |
| 2006/0109983 A1 | 5/2006 | Young |
| 2008/0077336 A1 | 3/2008 | Fernandes |
| 2009/0230974 A1 | 9/2009 | Kojovic |
| 2009/0231769 A1 | 9/2009 | Fischer |
| 2010/0013632 A1 | 1/2010 | Salewske |
| 2011/0058285 A1 | 3/2011 | Wibben |
| 2011/0173496 A1 | 7/2011 | Hosek |
| 2011/0264388 A1 | 10/2011 | Gong |
| 2011/0264389 A1 | 10/2011 | Mynam |
| 2012/0086459 A1 | 4/2012 | Kim |
| 2012/0265457 A1 | 10/2012 | Donolo |
| 2012/0278013 A1 | 11/2012 | Ganesh |
| 2013/0006560 A1 | 1/2013 | Cern |
| 2013/0021039 A1 | 1/2013 | Bjorklund |
| 2013/0044111 A1 | 2/2013 | Vangilder |
| 2013/0096854 A1* | 4/2013 | Schweitzer, III .... G01R 31/085 702/59 |
| 2013/0100154 A1 | 4/2013 | Woodings |
| 2013/0100564 A1 | 4/2013 | Zhang |
| 2013/0241622 A1 | 9/2013 | Zerbe |
| 2014/0049264 A1 | 2/2014 | Ganesh |
| 2014/0074414 A1 | 3/2014 | Schweitzer, III |
| 2015/0081234 A1 | 3/2015 | Schweitzer, III et al. |
| 2015/0120218 A1 | 4/2015 | Garnacho |
| 2016/0077149 A1* | 3/2016 | Schweitzer, III ...... G01R 31/08 307/131 |
| 2016/0077150 A1 | 3/2016 | Schweitzer |
| 2016/0084893 A1 | 3/2016 | Schweitzer |
| 2016/0216310 A1* | 7/2016 | Schweitzer, III ...... G01R 31/11 |
| 2017/0012424 A1 | 1/2017 | Schweitzer |
| 2017/0063566 A1* | 3/2017 | Seminario ............. H04L 63/029 |
| 2017/0082675 A1 | 3/2017 | Schweitzer |
| 2017/0146613 A1 | 5/2017 | Schweitzer |
| 2018/0145505 A1* | 5/2018 | Li ........................ G01R 23/167 |

FOREIGN PATENT DOCUMENTS

| | | |
|---|---|---|
| EP | 164711 | 12/1991 |
| EP | 244649 | 4/1992 |
| EP | 627085 | 12/2005 |
| GB | 1463755 | 2/1977 |
| WO | 9519060 | 7/1995 |
| WO | 2007135073 | 11/2007 |
| WO | 2010099585 | 9/2010 |
| WO | 2013119315 | 8/2013 |

OTHER PUBLICATIONS

Masaoki Ando, Edmund O. Schweitzer III, R. A. Baker, Development and Field-Data Evaluation of Single-End Fault Locator for Two-Terminal HVDC Transmission Lines, IEEE Transactions on Power Apparatus and Systems, vol. PAS-104, No. 12, 1985.

Masaoki Ando, Fault Location Techniques for HVDC Lines: Analysis, Development, Simulation, and Field-Data Evaluation, 1984.

P.F. Gale, Overhead Line Fault Location Based on Travelling Waves & GPS, 1993.

Harry Lee, Development of an Accurate Transmission Line Fault Locator Using the Glabal Positioning System and Satellites, 1994.

Hewlett Packard, Traveling Wave Fault Location in Power Transmission Systems, Application Note 1285, 1997.

Michael A. Street, Delivery and Application of Precise Timing for a Traveling Wave Powerline Fault Locator System, 1990.

Sergio Luiz Zimath, Marco Antonio Ramos, Jayme Silva Filho, Joaquim Moutinho Beck, Nei Mueller, Traveling Wave-Based Fault Location Experiences, 2010.

Qualitrol Corporation, Telefault TWS Traveling Wave Fault Locator, Qualitrol Brochure 2004.

Elhaffar, Power Transmission Line Fault Location Based on Current Traveling Waves. TKK Dissertations 107, Espoo 2008, Helsinki University of Technology. Department of Electrical Engineering, Dec. 2008.

Reason International, Inc., Traveling Wave Fault Location in Power Transmission Systems, White Paper.

Carlos Alberto Dutra, Rafael Rosar Matos, Sergio Luiz Zimath, Jurandir Paz De Oliveira, Joao Henrique Monteiro De Resende, Joaquim Amerigo Pinto Moutinho, Fault Location by Traveling Waves: Application in High Impedance Events.

Normann Fischer, et al., Protective Relay Traveling Wave Fault Location, Feb. 9, 2012.

(56) References Cited

OTHER PUBLICATIONS

Borghetti, et al, "On the use of continuous-wavelet transform for fault location in distribution power systems." International Journal of Electrical Power & Energy Systems. Nov. 2006.

Maher M.I. Hashim, et al., Impedance-Based Fault Location Techniques for Transmission Lines, Sep. 2009.

Zheng, et al., Study on Impedance-Traveling Wave Assembled Algorithm in One-Terminal Fault Location System for Transmission Lines, Apr. 2008.

Gabriel Benmouyal, Karl Zimmerman, Experience With Subcycle Operating Time Distance Elements in Transmission Line Digital Relays, Presented at the 37th Annual Western Protective Relay Conference Oct. 2010.

Edmund O. Schweitzer, III, Armando Guzman-Casillas, Mangapathirao Venkat Mynam, Veselin Skendzic, Bogdan Kasztenny, Stephen Marx, Locating Faults by the Traveling Waves They Launch, Feb. 10, 2014.

Toshio Tahagi, Jun-Ichi Baba, Katauhiko Usmura, Tishiaki Sakaguchi, Fault Protection Based on Travelling Wave Theory—Part I Theory, Jan. 24, 1977.

Baina He, et al. "A Novel Wave Based Differential Protection for Distributed Parameter Line." TELKOMNIKA Indonesian Journal of Electrical Engineering TELKOMNIKA 11.9 (2013): 5097-104.

Lanxi Tang, et al. "Travelling Wave Differential Protection Based on Equivalent Travelling Wave", 13th IET International Conference on Developments in Power System Protection (DPSP 2016), Mar. 7-10, 2016.

PCT/US2019/048103 Patent Cooperation Treaty, International Search Report and Written Opinion of the International Searching Authority, dated Nov. 8, 2019.

\* cited by examiner

DETECTION OF LOW-ENERGY EVENTS IN AN ELECTRIC POWER SYSTEM

RELATED APPLICATION

The present application claims the benefit under 35 U.S.C. § 119(e) of U.S. Provisional Patent Application No. 62/725,182 entitled "Detection of Pre-Fault Events in an Electric Power System", filed Aug. 30, 2018 which is herein incorporated by reference in its entirety and for all purposes.

TECHNICAL FIELD

The present disclosure relates generally to obtaining and analyzing traveling waves and, more particularly, to determining locations of pre-fault events, also referred to as low-energy events, generated within an electric power system.

BRIEF DESCRIPTION OF THE DRAWINGS

Non-limiting and non-exhaustive embodiments of the disclosure are described herein, including various embodiments of the disclosure with reference to the figures listed below.

DETAILED DESCRIPTION OF SPECIFIC EMBODIMENTS

Electrical power generation and delivery systems are designed to generate, transmit, and distribute electrical energy to loads. Electrical power generation and delivery systems may include equipment, such as electrical generators, electrical motors, power transformers, power transmission and distribution lines, circuit breakers (CBs), disconnects, buses, transmission lines, voltage regulators, capacitor banks, and the like. Such equipment may be monitored, controlled, automated, and/or protected using intelligent electronic devices (IEDs) that receive electric power system information from the equipment, make decisions based on the information, and provide monitoring, control, protection, and/or automation outputs to the equipment. For example, IEDs, such as relays, may obtain electrical measurements that indicate there is a fault on a power line and perform a protective action to protect the power system upon the occurrence of a fault. Faults on power lines may cause transients that are propagated along the power line, referred to as traveling waves useful for fault detection. Upon detecting a fault, the IED may calculate a location at which the fault occurred using the times at which the traveling waves were received.

However, such IEDs often discard the detected traveling wave information if a fault is not detected. As described below, IEDs may calculate the location of an event that launched the traveling waves. By calculating the location of events that produce traveling waves, operators may be informed of low-energy events, events that are of lower energy than fault events, which may allow for operators to improve monitoring of the power lines. Low-energy events may be indicative of flashovers, incipient faults, or other events that may evolve into a fault if left uncorrected.

Figure 1:
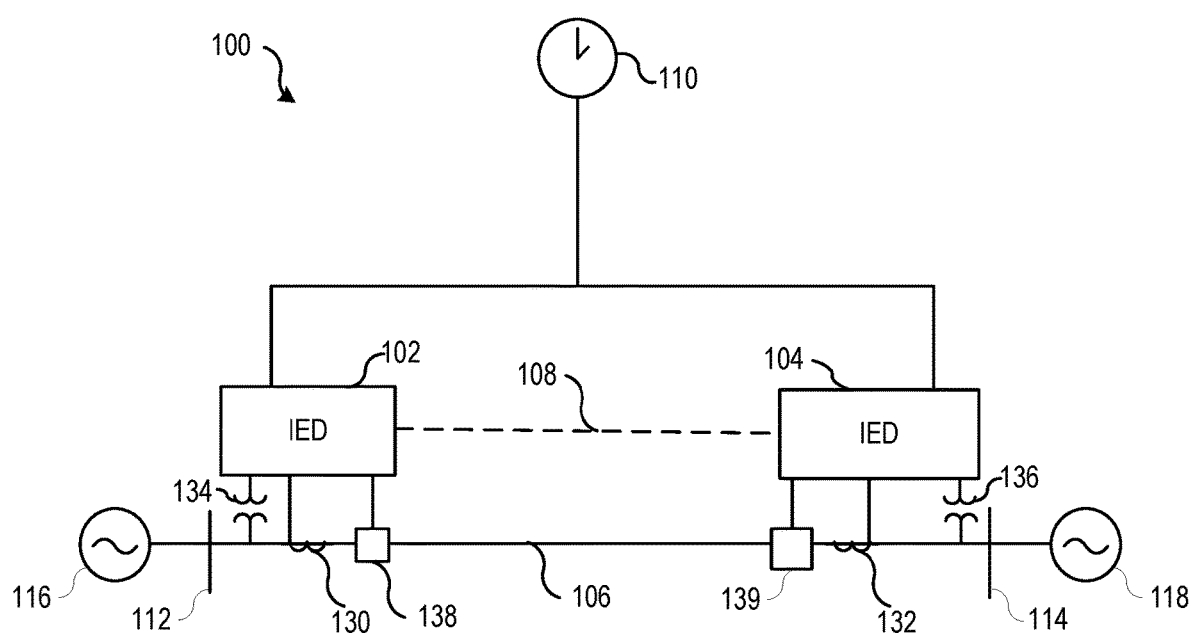
FIG. 1 is a block diagram of a system having an intelligent electronic device (IED) that determines locations of low-energy events in an electric power system, in accordance with an embodiment.

FIG. 1 is a block diagram of a system 100 for detecting and calculating a location of a source of high-frequency transient signals (e.g., traveling waves) in an electric power system. System 100 may include generation, transmission, distribution and/or similar systems. System 100 includes a conductor 106 such as a transmission line, distribution line, or other power line, connecting two nodes, which are illustrated as a local terminal 112 and a remote terminal 114. Local and remote terminals 112 and 114 may be buses in a transmission system supplied by generators 116 and 118, respectively. Although illustrated in single-line form for purposes of simplicity, system 100 may be a multi-phase system, such as a three-phase electric power delivery system.

System 100 is monitored by a local IED 102 and a remote IED 104 located at the local terminal 112 and the remote terminal 114 respectively, although additional IEDs may also be utilized to monitor other locations of the system. As used herein, an IED (such as IEDs 102 and 104) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. IEDs 102 and 104 may obtain electric power system information using current transformers (CTs) 130 and 132, potential transformers (PTs) 134 and 136. Alternatively, Rogowski coils, voltage dividers, and/or the like, may be used. IEDs 102 and 104 may also receive common time information from a common time source 110. The IEDs 102 and 104 may detect fault events on the power line using electrical signals from the CTs 130 and 132 and/or the PTs 134 and 136. In various embodiments, IEDs may obtain analog signals via CTs, PTs, or the like, whereas in other embodiments, IEDs may obtain digitized analog signals from merging units, which obtain electrical signals from the power system and communicate the digitized analog signals to the IED.

Common time source 110 may be any time source capable of delivering a common time signal to each of IEDs 102 and 104, such as a Global Navigation Satellite System ("GNSS") time signal. GNSS systems may be used by multiple devices and applications distributed across large areas. In addition to GNSS, common time source 110 may be embodied using an IRIG system, WWVB or WWV signals, a network-based system, such as the IEEE 1588 precision time protocol, and the like.

A data communication channel 108, such as a fiber optic channel, may allow IEDs 102 and 104 to exchange information relating to, among other things, traveling wave detection, traveling wave time, traveling wave polarity, time-domain incremental quantity based fault direction, and other measurements reflecting electrical conditions on conductor 106, such as voltages, currents, time-domain fault detection, and fault location. According to some embodiments, a time signal based on common time source 110 may be distributed to and/or between IEDs 102 and 104 using data communication channel 108. Data communication channel 108 may be embodied in a variety of media and may utilize a variety of communication protocols.

As mentioned above, high energy events, such as fault events, may cause traveling waves to be propagated on the power line to each of the IEDs 102 and 104. IEDs 102 and 104 may detect these fault events and send signal(s) to open the CBs 138 and/or 139. In several embodiments herein, the traveling waves on the power line may be used to detect and calculate the location of the fault. For example, a double-ended traveling wave fault locating (DETWFL) method may use a time difference between a time at which a traveling wave is detected at the local IED 102 and a time at which a traveling wave is detected at the remote IED 104, as well as the line length and the traveling wave line propagation time (TWLPT) to compute the fault location. The IEDs 102 and 104 may monitor input signals of electrical conditions and associate measurements from the input signals with time stamps of when the measurements were taken. In certain embodiments, using DETWFL methods, a per-unit distance from the local terminal to a fault location (m) may be calculated using Eq. 1.

$$m = \frac{L}{2}\left(1 + \frac{\Delta t}{TWLPT}\right) \quad \text{Eq. 1}$$

where:

$\Delta t$ is the difference between the front traveling wave arrival time ($t_L$) at the local terminal and the front traveling wave arrival time ($t_R$) at the remote terminal, TWLPT is the traveling wave line propagation time, and L is the line length.

In other embodiments, IEDs may perform single-ended fault location methods that use reflections of traveling waves to determine fault location without remote measurements. For example, traveling waves may propagate from the event to the IED 102 and back to the event repeatedly. The IED 102 may calculate the fault location using Eq. 2:

$$m = \frac{\Delta t_L}{2} * TWLPT \quad \text{Eq. 2}$$

Where:

$\Delta t_L$ is the difference between the arrival time ($t_{L2}$) of the first reflection from the fault at the local terminal and the arrival time ($t_{L1}$) of the initial wave front from the fault to the local terminal, and TWLPT is the traveling wave line propagation time.

While these methods are given as examples, note that any suitable method of using traveling waves to determine the location of a fault may be used. In addition to high-energy fault events generating traveling waves, it has been observed that low-energy events (i.e., non-fault events), may generate traveling waves as well. For example, low-energy events, such as partial discharge, may repeatedly occur due to dirty or damaged insulators, encroaching vegetation, failing insulators, brush fires, incipient cable faults, or the like.

Figure 2:
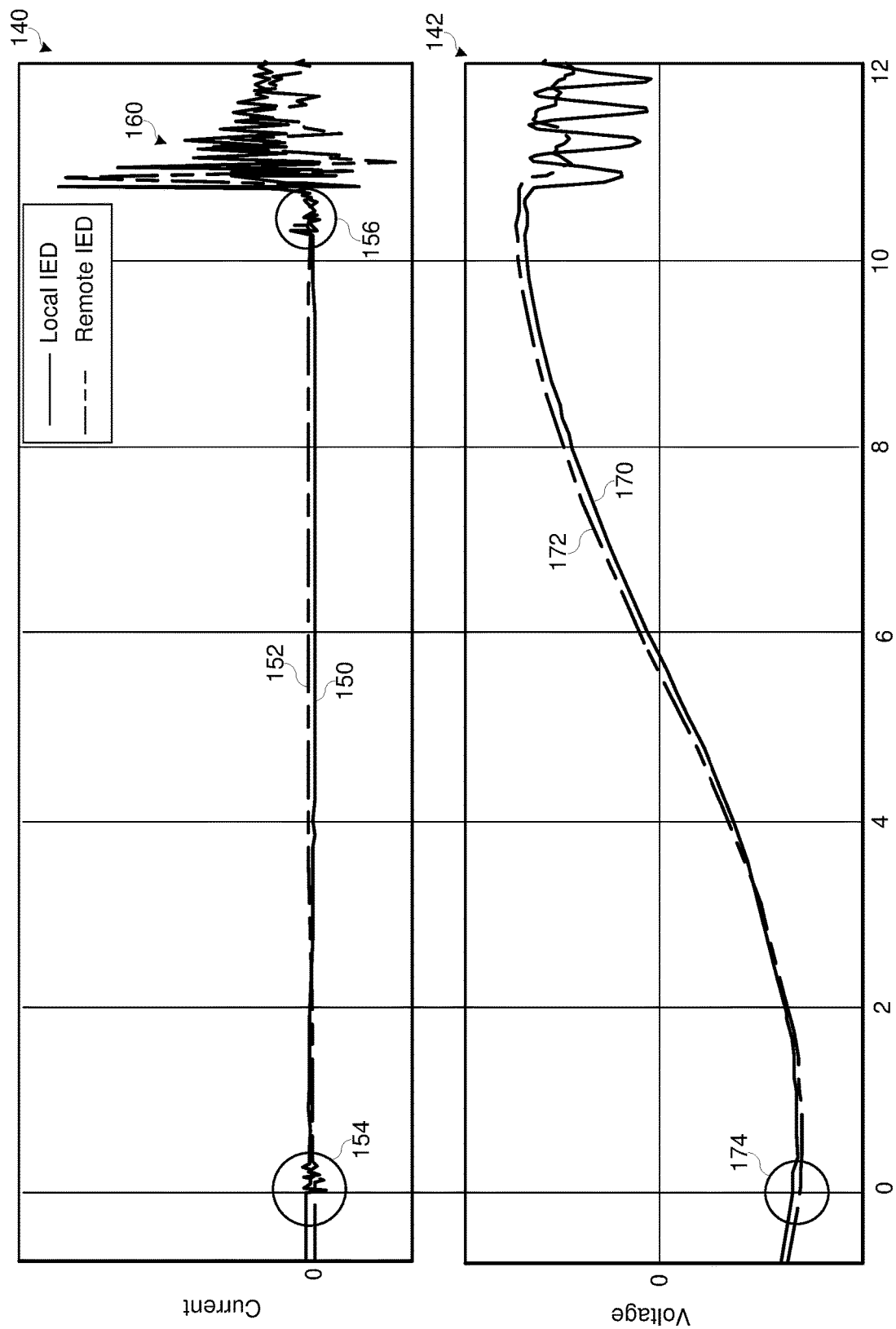
FIG. 2 is a set of voltage and current diagrams of low-energy events and a subsequent fault, in accordance with an embodiment.

FIG. 2 illustrates a current signal 140 and a voltage signal 142 where low-energy events are identified using time-aligned high-frequency measurements prior to a fault, in accordance with an embodiment. The local IED 102 receives input signals indicating the local current 150 and the local voltage 170 at the local terminal 112, and the remote IED 104 receives input signals indicating the remote current 152 and the remote voltage 172 at the remote terminal 114. The remote IED 104 may communicate the remote electrical measurements and the associated time stamps to the local IED 102 to allow the local IED 102 to analyze the time synchronized local electrical measurements and the remote electrical measurements. At around time 0ms, during the negative voltage peak 174, the remote IED 104 and the local IED 102 detect small amplitude, high-frequency, transient signals produced from a low-energy event 154 on the current signal. The low-energy event 154 may not be an actual fault but may be a pre-fault event from which faults have a higher likelihood of subsequently occurring at the same location. The location of the low-energy event 154 is also related to the time difference between the peaks of the traveling waves of the local and remote current signals 150 and 152, as described above with respect to fault locating methods.

At the positive voltage peak, at around time 10 ms, additional traveling waves 156 are detected on the current signals 150 and 152. Comparing the time between when the traveling wave is detected by the local IED 102 and when the traveling wave is detected by the remote IED 104 shows that the traveling waves of the low-energy event 154 and the traveling waves 156 associated with the fault event 160 are propagated from the same location on the power line.

As illustrated, at high-energy event 160 (i.e., a fault event), the IED detects an actual fault using line protection algorithms. While only the low-energy events 154 and 156 is shown preceding the traveling waves associated with fault event 160, low-energy events may be observed over time prior to the fault, depending on the type of event that is observed. These low-energy events may be happening on the power system repeatedly prior to the fault. Low-energy events may occur, for example, during maximum system voltage.

Figure 3:
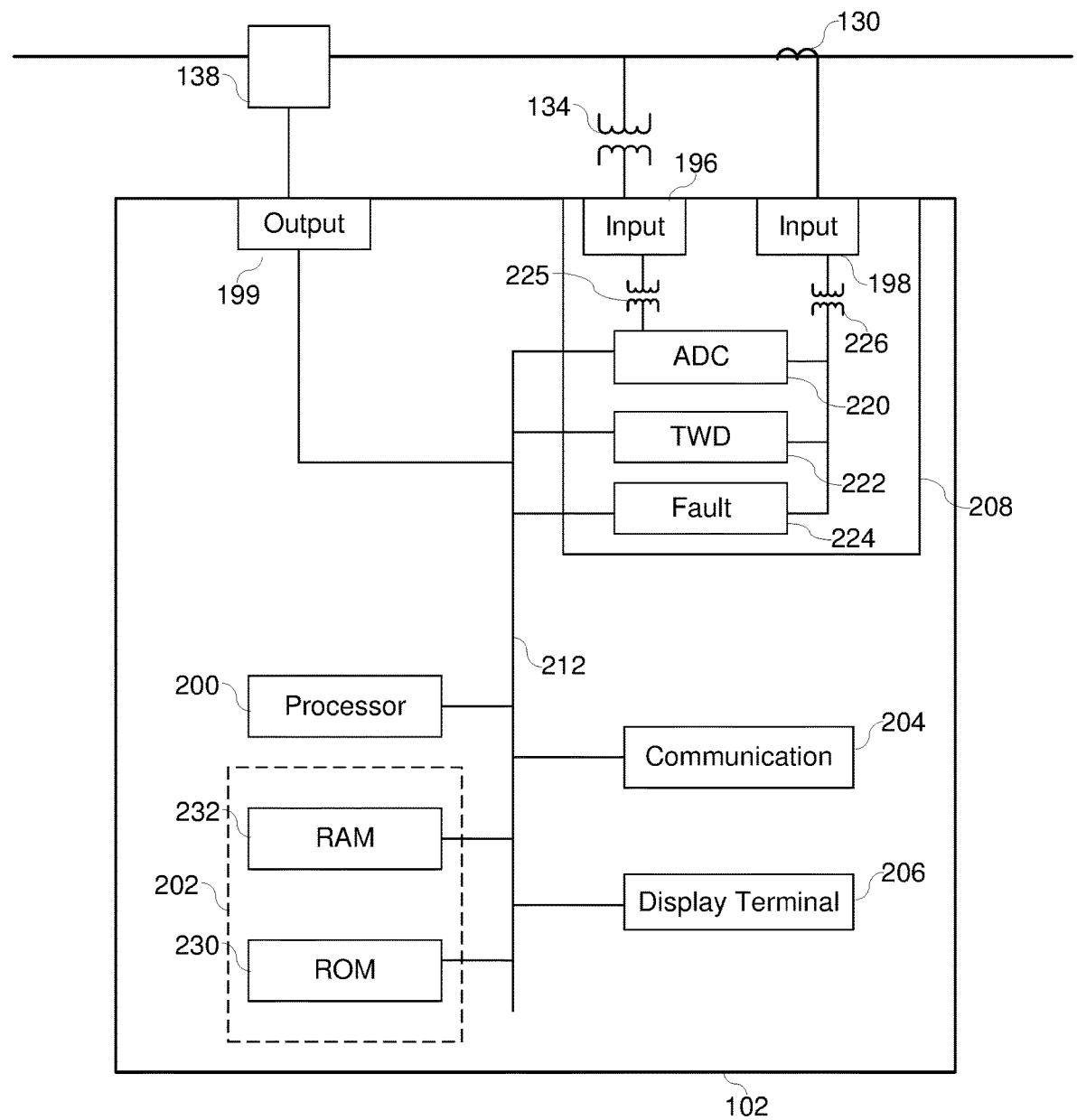
FIG. 3 is a block diagram of the IED of FIG. 1 that determines locations of low-energy events, in accordance with an embodiment.

FIG. 3 is a block diagram of the IED 102 that detects traveling waves and provides the location of low-energy events that are not associated with a fault. The IED 102 may be connected to a CT 130 and a PT 134 via inputs 196 and 198 to allow the IED 102 to receive signals of electrical conditions (e.g., voltage and current). The IED 102 may be connected to the CB 138 via the output 199 to allow the IED 102 to send a signal to the CB 138 to open the CB 138. The inputs 196 and 198 and output 199 may refer to ports, connectors, and the like, used to connect the IED 102 to other devices. In other embodiments, the IED may obtain signals from the power system and send commands to the CB using a merging unit. The IED 102 may further include one or more processors 200, a computer-readable medium (e.g., memory 202), a communication interface 204, a display terminal 206, and detection circuitry 208 communicatively coupled to each other via one or more communication buses 212.

Processor 200 may be embodied as a microprocessor, a general-purpose integrated circuit, an application specific integrated circuit (ASIC), a field programmable gate array (FPGA), and/or other programmable logic devices. It should be noted that the processor 200 and other related items in FIG. 3 (e.g., the memory 202 and/or the detection circuitry 208) may be generally referred to herein as "processing circuitry." Furthermore, the processing circuitry may be a single contained processing module or may be incorporated wholly or partially within any of the other elements within the electronic device 102. It should be noted that FIG. 3 is merely one example of a particular implementation and is intended to illustrate the types of components that may be present in the IED 102.

In the intelligent electronic device 102 of FIG. 3, the processor 200 may be operably coupled with the memory 202 to perform various algorithms. Such programs or instructions executed by the processor 200 may be stored in any suitable article of manufacture that includes one or more tangible, computer-readable media at least collectively storing the instructions or routines, such as the random-access memory (RAM 232) and the read-only memory (ROM 234).

In the illustrated embodiment, the IED 102 includes detection circuitry 208 that detects various electrical conditions of the power line based on the input signals. The detection circuitry 208 may include transformers 225 and 226 that transform the input signals to levels that may be sampled by the IED 102. The detection circuitry 208 may include analog-to-digital converter(s) 220 that sample the current and voltage signals and produce digital signals representative of measured current and measured voltage on the power line, which may be transmitted to the processor. The detection circuitry 208 may include traveling wave detection circuitry 222 that filters low frequency signals (e.g., via a bandpass or other filter) and provides a signal indicating that one or more traveling waves are detected on the power line. Further, the detection circuitry 208 may include fault detection circuitry (e.g., a comparator) that provides a signal indicating that a high-energy event, such as a fault event, is detected. For example, if current exceeds a preset threshold and/or current-over-time exceeds a preset threshold, the fault detection circuitry 224 may provide a signal to the processor 200 indicating that a high-energy event has occurred. As illustrated, the traveling wave detection circuitry 222 and fault detection circuitry 224 may be embodied as separate logic circuits on an FPGA. While these are described in the illustrated embodiment as being performed in hardware, as mentioned above, note that any combination of hardware and software (e.g., as instructions stored in the memory 202) may be used depending on the implementation.

The communication interface 204 may include a fiber optic transceiver that communicates with another IED, such as the remote IED 104, to receive signals indicating one or more measurements from the other IED. In some embodiments, the processor 200 may send, via the transceiver of the communication interface 204, a signal indicating the location of the fault to a central monitoring station.

The IED 102 may include a display terminal 206 to display a table of the low-energy events. Further, the processor 200 may activate alarms, such as LEDs or alerts on the display screen, upon repeated detection of low-energy events. In certain embodiments, the processor 200 may effect a control operation on the system 100 by sending a signal to the CB 138 via the output 199. For example, the processor 102 may send a signal to control operation of the CB 138 to disconnect the power line 106 from a power source, such as the generator 116, upon detecting a fault.

Figure 4:
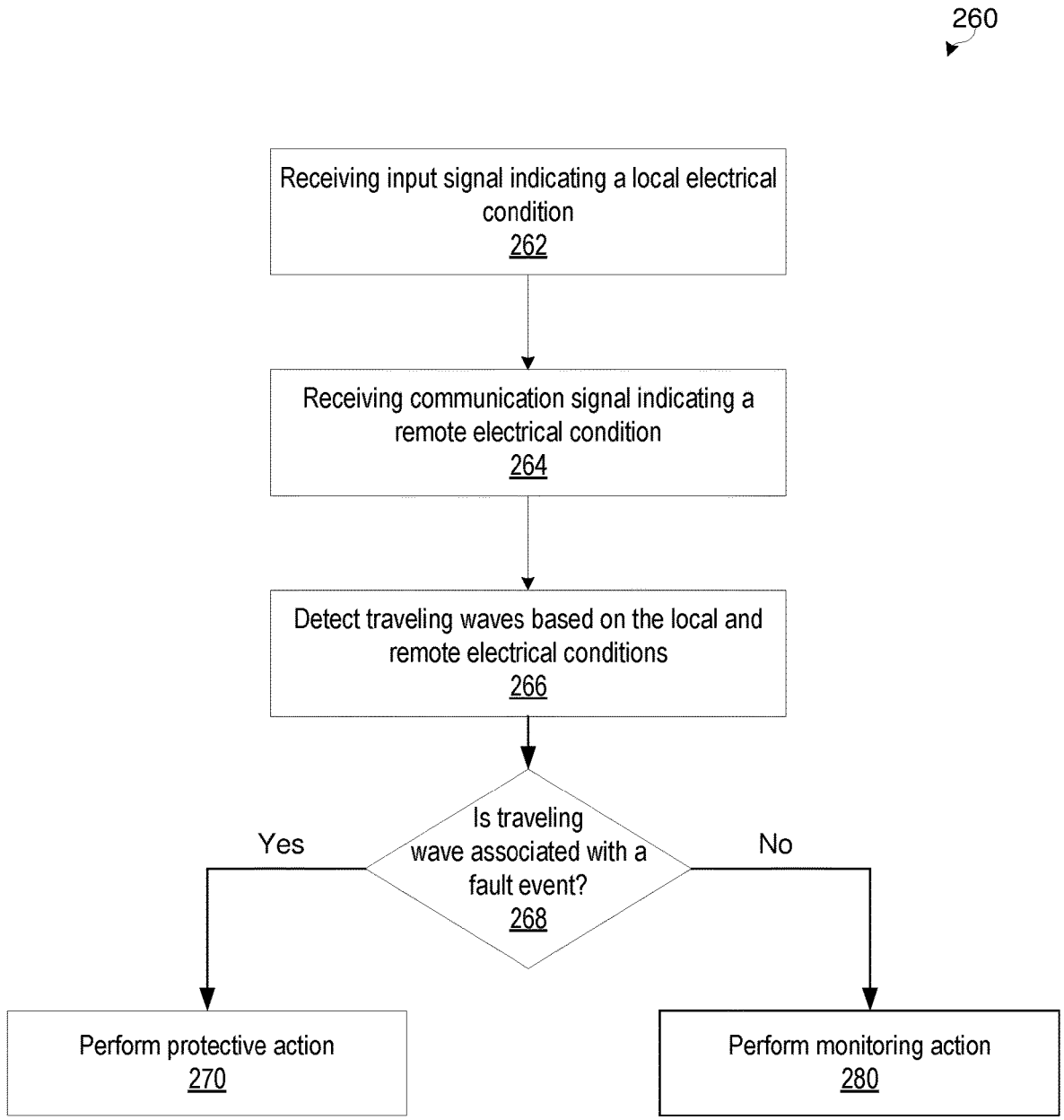
FIG. 4 is a flow diagram of a process that may be performed by the IED of FIG. 1, in accordance with an embodiment.

FIG. 4 is a flow diagram of a process 260 that may be performed by the IED 102 in monitoring low-energy events. The process may be stored as instructions (e.g., code) in the memory 202 of the IED 102 to execute the steps described herein. As illustrated, the local IED 102 may receive, via the inputs 196 and 198, an input signal indicating a local electrical condition, such as a local current and/or a local voltage, of the power line (block 262). Further, the local IED 102 may receive, via the communication interface 204, a communication signal indicating a remote electrical condition, such as a remote current and/or a remote voltage, of the power line (block 264).

The local IED 102 may detect traveling waves based on the local and remote electrical conditions (block 266). For example, the traveling wave detection circuitry 222 may provide a traveling wave disturbance detection signal that indicates that a local traveling wave was detected at the local IED 102 based on the high frequency signals in the current on the power line. Further, remote current measurements and the associated time stamps may indicate that a traveling wave was detected by the remote IED 104.

The local IED 102 may then identify the event that produced the traveling waves as a high-energy event, such as a fault event, or a low-energy event in which a fault has not occurred (diamond 268). To identify whether the traveling waves are associated with a fault or high-energy event, the processor 200 may wait a predetermined period of time (e.g., 20 ms, 30 ms, etc.) to receive a fault signal indicating that there is a fault on the power line. For instance, if the fault detection circuitry 224 detects that the current on the power line has exceeded a threshold, the fault detection circuitry 224 may provide the fault signal indicating that the fault is presently on the power line.

The local IED 102 may perform various actions when an event is detected depending on the energy characteristics of the event. That is, the local IED 102 may perform an action when the event is identified as being a high-energy event and perform a different action when the event is identified as being a low-energy event. For example, when the event is identified as being a fault event, the local IED 102 may send a signal to open the CB 138 to electrically disconnect a portion of the power system to protect the power system (block 270). Further, upon detection of the fault event, the local IED 102 may communicate a location of the fault to a central monitoring station and/or provide the location of the fault on the display terminal 206.

When the event is identified as being a low-energy event (i.e., not associated with a fault event), the local IED 102 may perform a monitoring action of counting low-energy events (block 280). The IED 102 may identify low-energy events as events that produce traveling waves propagated to the local IED 102 and the remote IED 104 (as indicated by the traveling wave circuitry 222) but have currents and/or voltages that do not exceed expected operating currents and/or voltages from normal operations (e.g., where the fault signal indicates that a fault is not present) within a period of time from when the traveling waves are detected. These expected operating currents, voltages, and period of time may be set as thresholds (e.g., via user settings), which may depend on the particular application.

As explained below, the local IED 102 may count the number of low-energy events at line intervals, also referred to as bins, on the power line without causing a protective action to be performed (e.g., without sending a signal to open the circuit breaker 138 and/or without disconnecting any portion of the power system). In certain embodiments, the local IED 102 may confirm that the low-energy event is a valid low-energy event to be stored. For example, the local IED 102 may confirm that the local and remote traveling waves are of the same polarity to ensure that the detected traveling wave originated from an event that occurred on the power line between the local IED and the remote IED. That is, the IED 102 may use the polarity of the traveling waves to confirm the direction of the event.

When the low-energy event is valid to be stored, the local IED 102 may determine a bin that the location of the low-energy event falls within. For instance, the local IED 102 may have, in the memory 202, a table of bins with corresponding counters of the total number of low-energy events at each bin. In this example, the local IED 102 may increment the counter of the bin in which the location of the low-energy event occurred.

In some embodiments, the IED 102 may receive a request from another electronic device, such as a central monitoring station, to obtain one or more values from the table. The IED 102 may communicate the table to the central monitoring station upon receiving the request. In certain embodiments, the IED 102 may, upon obtaining a low-energy event count for a given location that exceeds a user-specified threshold, send an alarm and/or send the table to the central monitoring station to notify operators of the repeated low-energy events.

In the illustrated embodiment, the local IED 102 may store the table in volatile memory (e.g., RAM 232) and/or nonvolatile memory (e.g., ROM 230). The processor 200 may update the counter of the corresponding bin of the low-energy event in the RAM 232. The processor 200 may update the nonvolatile memory with the table in the volatile memory periodically, at software updates, or the like. Upon restarting the local IED 102, the local IED 102 may load the table of counters in the nonvolatile memory into the volatile memory.

In some embodiments, the IED may be configurable, during commissioning, to selectively monitor low-energy events and/or high-energy events. For example, the IED may display on the display terminal, a prompt of potential settings to enable line monitoring of low-energy events. The IED may receive, via user inputs at the IED, one or more user settings of selections from the potential settings. Further, the IED may adjust the monitoring conditions to monitor low-energy events on the power line according to the settings. The settings may include the number of low-energy events at which to alarm (i.e., a line monitoring alarm threshold), locations of blocking regions and the respective blocking region size, or the like.

Figure 5:
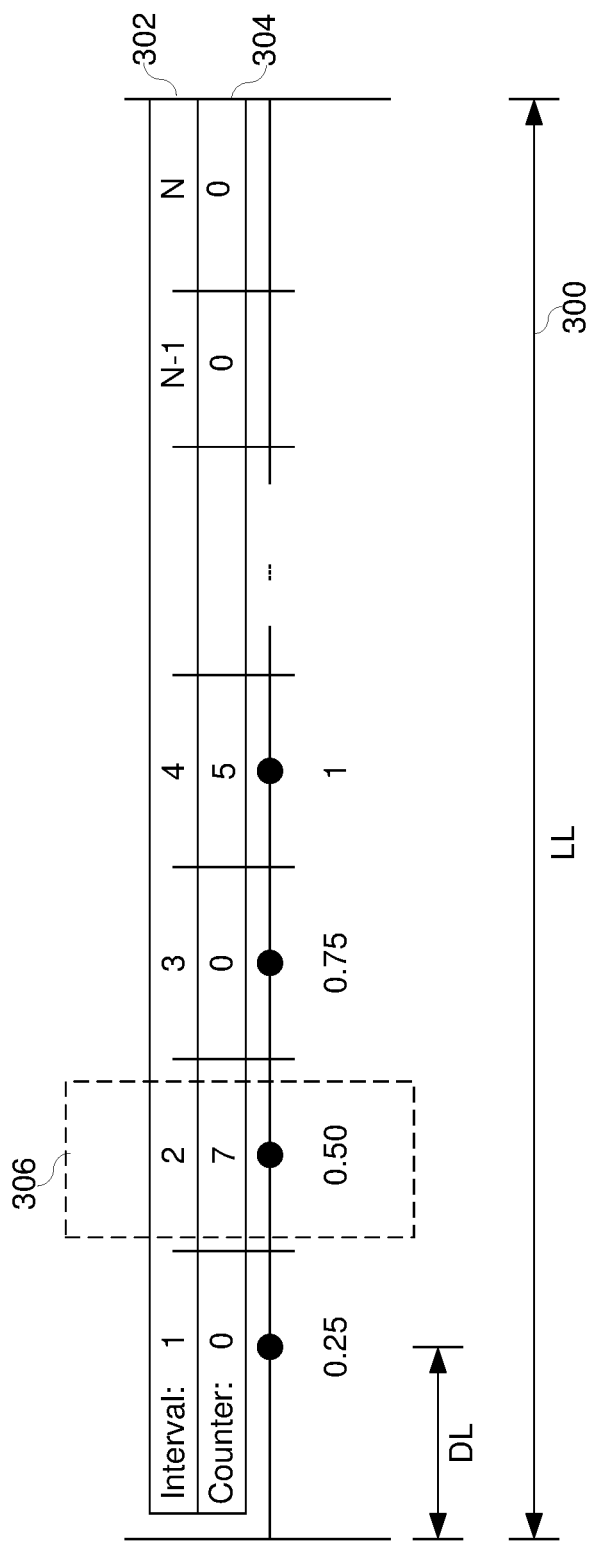
FIG. 5 is a set of location intervals (bins) that may be used to count low-energy events detected by the IED of FIG. 1, in accordance with an embodiment.

FIG. 5 is a table of bins 302 of a power line of a particular line length (LL) 300. In the illustrated embodiment, the local IED 102 includes a table of 0.25 mile line bins with midpoints at 0.25 miles, 0.50 miles, 0.75 miles, 1.00 miles, 1.25 miles, etc. In the illustrated example, the first and last bins are of different sizes than remaining bins, however, any suitable bins may be used. The table may include counters 304 that correspond to each of the bins. Upon determining a location of a low-energy event and validating the low-energy event, the processor 200 may determine which bin from the table corresponds to the location. The processor 200 may increment the counter 304 of the bin in the table corresponding to the location and store the updated table with the incremented counter in the memory. When the counted number of low-energy events exceeds a threshold, the local IED 102 may provide an alarm indicating that repeated low-energy events have occurred at a particular bin.

In the illustrated embodiment, the local IED 102 may receive a user selection of a line monitoring alarm threshold. When updating the table, the local IED 102 may compare the counter of each of the bins to the line monitoring alarm threshold. When a counter of table exceeds the line monitoring alarm threshold, the local IED 102 may provide an alarm to notify an operator that repeated low-energy events have occurred at a particular bin on the power line.

As illustrated, the local IED 102 may receive user settings of one or more blocking regions 306 on the power line to mask locations on the power line that produce traveling waves under normal operating conditions, such as a tapped transformer which, when energized or disconnected, generates traveling waves at the location of the tap. The local IED 102 may log and alarm from detection of low-energy events within the blocking region 306 using different thresholds that reflect the normal activity. For instance, the user may input a blocking location and a blocking radius. Further, the user may input a blocking region alarm threshold, different than a line monitoring alarm threshold of the bins outside of the blocking region. If a tapped transformer is expected to be energized or disconnected a certain number of times, the blocking region alarm threshold may account for the normal activity expected. In certain embodiments, the local IED 102 may reset a counter of the blocking region after a predetermined period of time to at allow monitoring of a daily event total in the blocking region, while allowing the counters outside of the blocking region to continue accruing totals over longer time periods.

The IED may then store the location of the low-energy event based on the traveling waves detected. By monitoring power lines for low-energy events that are not associated with faults, power system operators may monitor and assess aspects of the power line that may subsequently result in fault events if left unattended. That is, providing locations of low-energy events that have a higher likelihood of causing a fault than other locations may allow operators to address these high likelihood locations to reduce fault events that may occur in the future, thereby allowing for improved reliability of the power system.

In an effort to provide a concise description of these embodiments, not all features of an actual implementation are described in the specification. The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A method, comprising:
    receiving, via an intelligent electronic device (IED), an input signal indicating a local electrical condition of a power line;
    detecting, via the IED, traveling waves caused by an event, wherein the traveling waves are detected based at least in part on the local electrical condition of the power line;
    identifying, via the IED, the event as a low-energy event, not associated with a fault on the power line, when a fault is not detected within a predetermined period of time of the event;

generating, via the IED, a location of the low-energy event on the power line based at least in part on the traveling waves;

determining, from a plurality of line intervals stored in the IED, a selected line interval that corresponds to the location of the low-energy event, wherein each line interval in the plurality represent a different portion of a total length of the power line;

incrementing a low-energy event counter of the selected line interval corresponding to the location; and providing an alarm when the low-energy event counter exceeds a line monitoring alarm threshold to indicate that the selected line interval has low-energy events occurring that are associated with a higher likelihood of a subsequent fault.

2. The method of claim 1, wherein the traveling waves comprise a local traveling wave detected from monitoring the local electrical condition and a remote traveling wave detected from monitoring a remote electrical condition, wherein the method comprises:

receiving a communication signal indicating a remote electrical condition of the power line measured from another IED; and determining the location of the low-energy event on the power line based at least in part on a difference between a time at which the IED detected the local traveling wave from monitoring the local electrical condition and a time at which the other IED received a remote traveling wave from monitoring the remote electrical condition.

3. The method of claim 1, comprising:
storing the incremented low-energy event counter of the selected line interval in memory of the IED.

4. The method of claim 1, comprising:
receiving a user selection of the line monitoring alarm threshold.

5. The method of claim 1, comprising:
receiving, from a central monitoring station, a request for a table of low-energy events; and
upon receiving the request, sending the table to the central monitoring station.

6. The method of claim 1, comprising determining that the low-energy event is on the same power line as the IED and another IED.

7. The method of claim 1, comprising:
performing a protective action that affects at least one connection of the power system when the traveling waves are associated with a fault event; and
performing a monitoring action, which does not affect any connections of the power system, when the traveling waves are associated with a low-energy event.

8. The method of claim 1, wherein the traveling waves are caused by a pre-fault event that is a precursor of subsequent fault.

9. An intelligent electronic device (IED) configured to monitor a power line, comprising:
an input configured to receive an input signal indicating a local electrical condition of the power line;
memory; and
one or more processors operatively coupled to the memory, wherein the one or more processors are configured to execute instructions stored on the memory to cause operations comprising:
obtaining an indication that traveling waves caused by an event were detected on the power line based at least in part on the local electrical condition of the power line;

identifying the event as a low-energy event, not associated with a fault on the power line, when the local electrical conditions of the power line do not exceed a threshold within a predetermined period of time of the event; and
determining a location of the low-energy event on the power line based at least in part on the traveling waves
selecting, from a plurality of line intervals stored in the IED, a selected line interval that corresponds to the location of the low-energy event, wherein each line interval in the plurality represent a different portion of a total length of the power line;
incrementing a low-energy event counter of the selected line interval corresponding to the location; and
providing an alarm when the low-energy event counter exceeds a line monitoring alarm threshold to indicate that the selected line interval has low-energy events occurring that are associated with a higher likelihood of a subsequent fault.

10. The IED of claim 9, wherein the one or more processors are configured to execute instructions to cause operations comprising:
storing the selected line interval with the incremented low-energy event counter in the memory of the IED.

11. The IED of claim 9, wherein the memory comprises both non-volatile memory and volatile memory, wherein the processor is configured to execute instructions to cause operations comprising:
storing a table of low-energy event counters from the volatile memory into the non-volatile memory; and
loading the table from the non-volatile memory into the volatile memory during start-up of the IED.

12. The IED of claim 9, comprising traveling wave disturbance detection circuitry configured to indicate that a traveling wave is detected on the power line and fault detection circuitry configured to indicate that a fault has occurred on the power line, wherein the low-energy event comprises an event that causes the traveling wave disturbance detection circuitry to indicate detection of traveling waves but does not cause the fault detection circuitry to indicate detection of a fault.

13. The IED of claim 9, wherein the local electrical condition comprises current of the power line, wherein the one or more processors are configured to determine that the traveling waves are associated with the low-energy event by comparing measurements of the current to a current threshold.

14. The IED of claim 9, wherein the traveling waves comprise a local traveling wave detected from monitoring the local electrical condition and a remote traveling wave detected from monitoring a remote electrical condition, wherein the one or more processors are configured to executed instructions stored on the memory to cause operations comprising:
receiving, via a communication link, a communication signal indicating a remote electrical condition of the power line measured from another IED; and
determining the location of the low-energy event on the power line based at least in part on a difference between a time at which the IED detected the local traveling wave from monitoring the local electrical condition and a time at which the other IED received a remote traveling wave from monitoring the remote electrical condition.

15. The IED of claim 9, wherein the one or more processors are configured to cause operations comprising:
displaying, on a display of the IED, a prompt of potential settings to enable line monitoring of low-energy events;

receiving, via user inputs at the IED, one or more user settings selected from the potential settings; and adjusting the IED to monitor low-energy events on the power line according to the user settings.

16. A non-transitory, computer-readable medium comprising instructions configured to be executed by one or more processors to cause operations comprising:

obtaining an indication that traveling waves caused by an event are detected on a power line based at least in part on a local electrical condition of the power line;

identifying the event as a low-energy event, not associated with a fault on the power line, when the local electrical conditions of the power line do not exceed a threshold within a predetermined period of time of the event; and determining a location of the low-energy event on the power line based at least in part on the traveling waves;

determining, from a plurality of line intervals stored in the IED, a selected line interval that corresponds to the location of the low-energy event, wherein each line interval in the plurality represent a different portion of a total length of the power line;

incrementing a low-energy event counter of the selected line interval corresponding to the location; and providing an alarm when the low-energy event counter exceeds a line monitoring alarm threshold to indicate that the selected line interval has low-energy events occurring that are associated with a higher likelihood of a subsequent fault.

17. The non-transitory, computer-readable medium of claim 16, comprising instructions configured to be executed by one or more processors to cause operations comprising:

receiving user settings of a blocking region on the power line to mask locations on the power line that produce traveling waves under normal operating conditions; and providing a blocking region alarm when the blocking region indicates abnormal operating conditions.

18. The non-transitory, computer-readable medium of claim 17, comprising instructions configured to be executed by one or more processors to cause operations comprising resetting a counter of a blocking region after a day to allow monitoring of a daily event total in the blocking region.

19. The non-transitory, computer-readable medium of claim 16, wherein the user settings comprise:

a first user setting of a blocking location;

a second user setting of a blocking radius;

a third user setting of a blocking region alarm threshold, different than a line monitoring alarm threshold of line intervals outside of the blocking region.

* * * * *